(12) United States Patent
Rorabaugh et al.

(10) Patent No.: US 11,398,725 B2
(45) Date of Patent: Jul. 26, 2022

(54) CIRCUIT FOR REDUCING FIRE HAZARD RISK IN A POWER DISTRIBUTION NETWORK

(71) Applicant: Southern California Edison Company, Rosemead, CA (US)

(72) Inventors: Jesse Rorabaugh, La Habra, CA (US); Andrew Swisher, Riverside, CA (US); Benjamin Garcia, La Palma, CA (US); Matthew Webster, Phelan, CA (US)

(73) Assignee: Southern California Edison Company, Westminster, CA (US)

( * ) Notice: Subject to any disclaimer, the term of this patent is extended or adjusted under 35 U.S.C. 154(b) by 117 days.

(21) Appl. No.: 16/850,219

(22) Filed: Apr. 16, 2020

(65) Prior Publication Data

US 2021/0328426 A1    Oct. 21, 2021

(51) Int. Cl.
*H02H 9/08* (2006.01)
*H02H 3/16* (2006.01)
(Continued)

(52) U.S. Cl.
CPC ............. *H02H 9/08* (2013.01); *G01R 31/086* (2013.01); *G01R 31/52* (2020.01); *G01R 31/62* (2020.01); *H02H 3/165* (2013.01); *H02H 7/045* (2013.01)

(58) Field of Classification Search
CPC ........ H02H 3/165; H02H 7/045; H02H 9/008; H02H 9/08; G01R 31/52; G01R 31/62; G01R 31/086; Y04S 10/52
(Continued)

(56) References Cited

U.S. PATENT DOCUMENTS 1,537,371 A    5/1925  Petersen
1,920,382 A *  8/1933  Griscom .................. H02H 9/08
                                                307/102
(Continued)

FOREIGN PATENT DOCUMENTS

CN    1635684 A  *  7/2005
CN    103915852 A *  7/2014
(Continued)

OTHER PUBLICATIONS

Jarvis Circuit. Exhibit A.
(Continued)

*Primary Examiner* — Kevin J Comber
(74) *Attorney, Agent, or Firm* — Jeffrey G. Sheldon; Cislo & Thomas LLP

(57) ABSTRACT

Disclosed is a system that reduces fault currents in a power grid, thereby reducing the risk of unintentionally igniting a fire when an object comes in proximity to a high voltage power line. The circuit comprises an isolation transformer, a neutral connection, a current compensating device, and an automatic recloser or other circuit interrupting type protection system. The isolation transformer may comprise a delta-delta or delta-zigzag transformer with a one-to-one ratio between the input and output voltages and phase angle. The current compensating device is connected to the neutral and configured to redirect a substantial portion of a fault current to ground through the isolation transformer neutral instead of the fault itself. The current compensating device may comprise an arc suppression coil tuned to match the capacitance of the three phase outputs, or an inverter.

13 Claims, 9 Drawing Sheets

(51) Int. Cl.
  *G01R 31/08* (2020.01)
  *G01R 31/62* (2020.01)
  *G01R 31/52* (2020.01)
  *H02H 7/045* (2006.01)

(58) Field of Classification Search
  USPC .......................................................... 361/47
  See application file for complete search history.

(56) References Cited

U.S. PATENT DOCUMENTS

| | | | |
|---|---|---|---|
| 2,296,109 | A | 9/1942 | Light |
| 6,573,726 | B1 | 6/2003 | Roberts et al. |
| 10,439,432 | B2 | 10/2019 | Eckhardt et al. |
| 2010/0176755 | A1* | 7/2010 | Hoadley ............... H02P 27/06 363/5 |
| 2018/0226796 | A1* | 8/2018 | Anderson ............... H02J 3/01 |
| 2019/0022953 | A1 | 7/2019 | Prasad et al. |
| 2019/0229523 | A1* | 7/2019 | Rostron ............... H02H 7/26 |

FOREIGN PATENT DOCUMENTS

| | | | | |
|---|---|---|---|---|
| CN | 107919662 | A * | 4/2018 | |
| DE | 2802174 | | 7/1979 | |
| EP | 0888661 | | 5/1997 | |
| EP | 2530804 | | 5/2012 | |
| EP | 2530804 | A1 * | 12/2012 | ............... H02H 9/08 |
| WO | WO-2007017618 | A1 * | 2/2007 | ............ H02M 1/425 |

OTHER PUBLICATIONS

Schlabbach, Jürgen. "Short-Circuit Currents—Power system with resonance earthing (Petersen-coil)".

Helmut Karger. "Zero sequence voltage in three-phase networks". 2013.

Fischer et al. "Methods For Detecting Ground Faults In Medium-Voltage Distribution Power Systems". Schweitzer Engineering Laboratories, Inc. 2006.

* cited by examiner

FIG. 6A
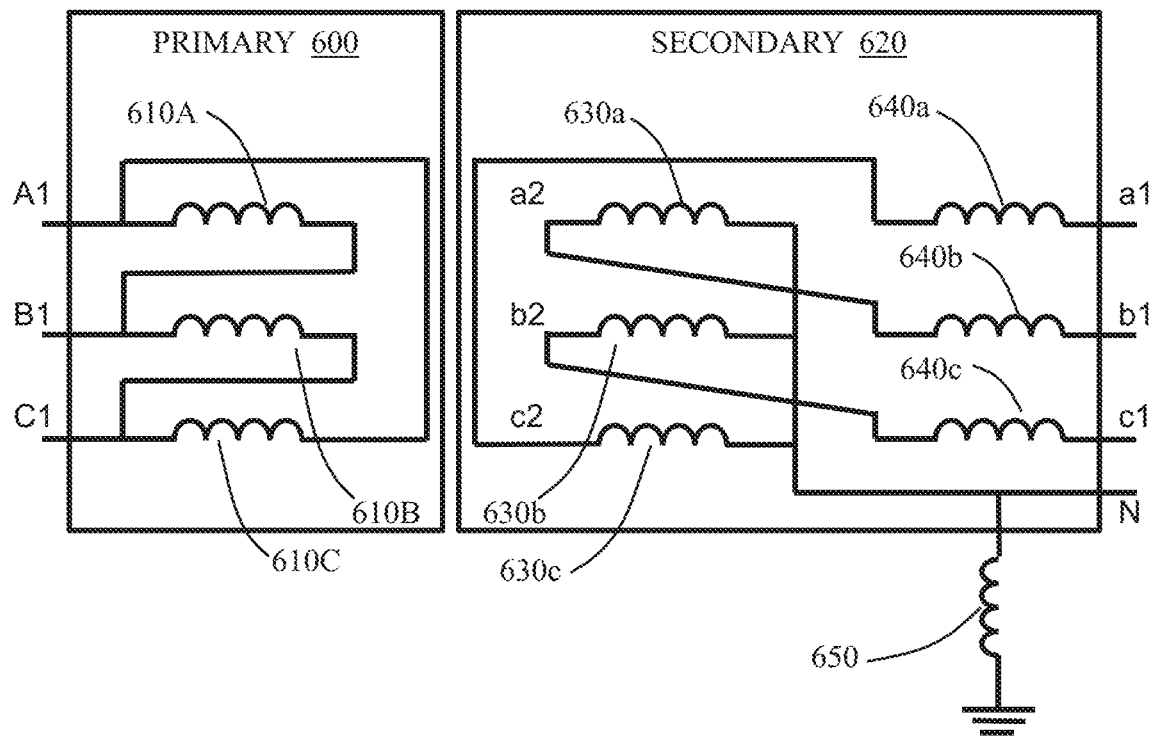
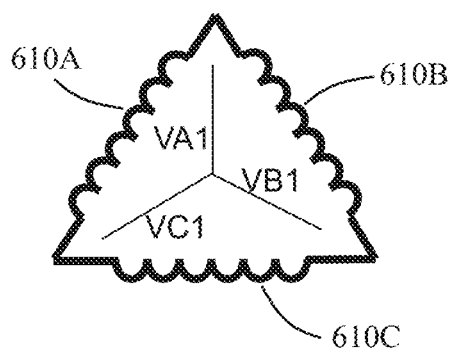
FIG. 6B
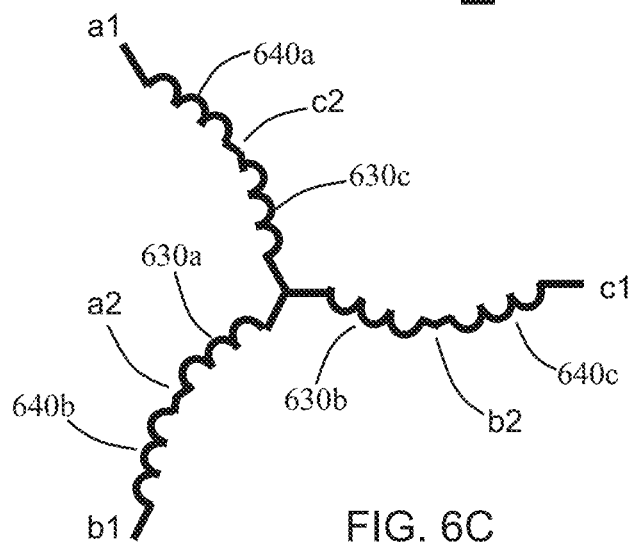
FIG. 6C

FIG. 8A
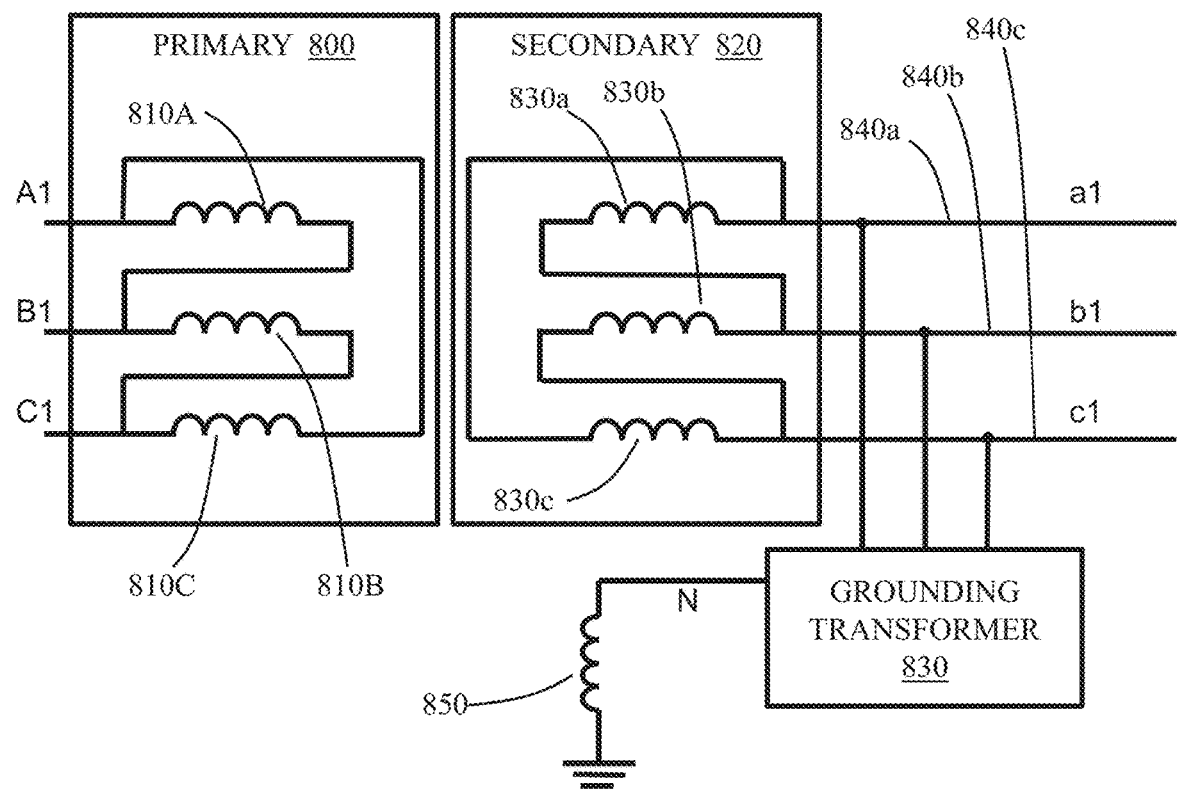
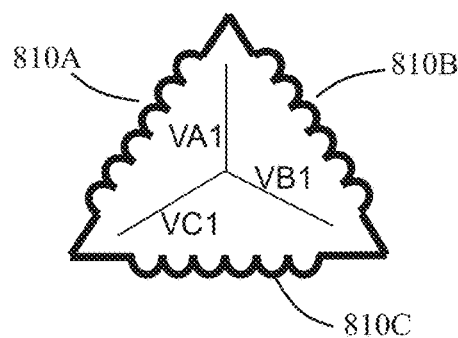
FIG. 8B
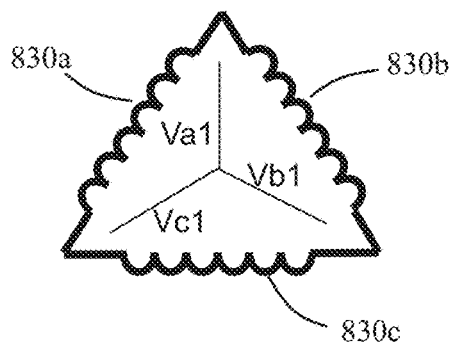
FIG. 8C

CIRCUIT FOR REDUCING FIRE HAZARD RISK IN A POWER DISTRIBUTION NETWORK

TECHNICAL FIELD

This invention relates to a system for reducing risk of fire by a municipal power grid. In particular, the invention relates to a circuit for electrically isolating a fault in the grid infrastructure and diverting current away from the source of a fault.

BACKGROUND

Modern civilization is reliant on the wide-scale distribution of affordable power. This power is distributed in the form of electricity to our homes and businesses by an expansive power distribution network including power plants, substations, and power lines. This power, typically in the form of three phase electricity, is commonly mounted atop power poles that branch out from power plants and into our communities and down our suburban streets. Although incredibly safe, the power lines are sometimes susceptible to fault events such as trees, mylar balloons, car accidents, natural disasters, etc. For example, trees sometimes can grow in directions and make direct connect with power lines, automobiles sometimes collide with power poles, and tornadoes sometimes topple power lines to the ground. In each of these circumstances, high voltage lines may come in contact with potentially flammable materials and cause ignition.

A typical situation is shown in FIG. 1 which illustrates a transformer 100 with a primary 102 and a secondary 120 in the form of a grounded wye. The wye secondary includes three coils or windings 130a-130c, each of which is connected to one line of a three phase power line 110a-110c on the outputs of the secondary 120. The coils 130a-130c connected at a common point to form a neutral, N. When one line 1110c of the three phase power line comes in contact with an object 150, for example, a fault current runs from ground, through the neutral, through the third power line 130c, and back to earth through the object 150. The fault current, FC1, is enabled, in part, by the transformer ground connection.

Concerning fault currents can arise in ungrounded transformers, as well, as illustrated in the ungrounded wye secondary 120 shown in FIG. 2. When an object 150 comes in contact with one 110c of the three phase wires, the fault current that runs to ground through the object may be supplied by the other two lines (phases) 110a, 110b. Where these wires 110a-110c are part of an overhead power line, the overhead lines are capacitively coupled to the ground. The longer the power lines, the greater the capacitance. This capacitance, represented by capacitors 140a, 140b, may then complete the path for current through the object 150 via the transformer's windings. As such, the ungrounded transformer 120 actually facilitates the flow of the fault current FC2 through the object.

In the scenarios shown in FIGS. 1 and 2, the fault current may result in a risk of fire ignition or other consequences. There is therefore a need for a power distribution network that reduces this fault current and fault energy to minimize the fire ignition risk for a category of power circuits in some circumstances.

SUMMARY

The invention in some embodiments features a novel system for reducing ground fault currents in a municipal power grid, thereby reducing the risk of igniting a fire where ground faults occur in powerline networks. This includes faults related to powerlines contacting or in arcing proximity to grounded equipment/objects, foreign objects bridging connections between a power line to grounded equipment/objects, and a powerline in contact with earth. The circuit comprises an isolation transformer, a neutral connection, a current compensating device, and a protection system. The isolation transformer includes a primary side connection to the three phase input from the power grid, and a secondary side connected to a section of distribution circuitry. The isolation transformer effectively has a one-to-one ratio between the input and output line-to-line voltages. The phase angle is constant which results from a delta-delta or delta-zigzag transformer. The current compensating device is connected to the neutral and configured to redirect a substantial portion of a fault current to a ground electrode instead of the ground fault connection location. The current compensating device may comprise of inductor(s), an arc suppression coil, and/or an inverter tuned to match the capacitance of the three phase outputs. When delta-delta isolation transformer connection is used, a grounding bank connected wye-grounded delta can be employed to provide a neutral connection for an additional current compensating device. The protection system includes a circuit breaker. e.g., an automatic recloser with a relay, is configured to clear the fault and transmit alerts if necessary. The relay is configured to measure a voltage of the isolation transformer from the transformer neutral or the neutral of a grounding transformer.

In some embodiments, the current compensating device comprises of inductor(s) or an arc suppression coil connected to the transformer neutral and a ground electrode. In other embodiments, the current compensating device comprises an inverter configured to inject current to redirect some or all of the fault current to the grounding electrode. In some embodiments, the isolation transformer comprises the neutral and the current compensating device is connected to the isolation transformer neutral. In other embodiments, the circuit includes a grounding bank with a neutral, and the current compensating device is connected to the neutral of the grounding bank.

The protection system comprises of a fault interrupting device(s), measurement devices, and a relay(s) Examples of fault interrupting devices include circuit breaker(s), automatic reclosers, and fault interrupters. Examples for measurement devices include current transformers, potential transformers, and resistive or capacitive sensors. Relays are typically connected to accept the measurement devices and provide control signals to the fault interrupting devices. The protection system may further include at least one fuse.

The present invention may be installed in proximity to fire hazard areas to reduce the probability of the power grid unintentionally igniting a wildfire or other fire from single phase ground faults to the high voltage power line. It is believed, using the present invention, that the risk of starting a fire from single phase to ground faults is reduced by approximately 90 percent relative to conventional bare wire electric distribution systems in operation currently.

DRAWINGS

The present invention is illustrated by way of example and not limitation in the figures of the accompanying drawings, and in which:

FIG. 6A is a schematic diagram of a delta-zigzag transformer, in accordance with a first embodiment of the present invention;

FIG. 6B is a schematic diagram of a primary side of the delta-zigzag transformer, in accordance with a first embodiment of the present invention;

FIG. 6C is a schematic diagram of a secondary side of the delta-zigzag transformer, in accordance with a first embodiment of the present invention;

FIG. 8A is a schematic diagram of a delta-delta transformer, in accordance with a second embodiment of the present invention;

FIG. 8B is a schematic diagram of a primary side of the delta-delta transformer, in accordance with a second embodiment of the present invention;

FIG. 8C is a schematic diagram of a secondary side of the delta-delta transformer, in accordance with a second embodiment of the present invention;

DESCRIPTION

Figure 1:
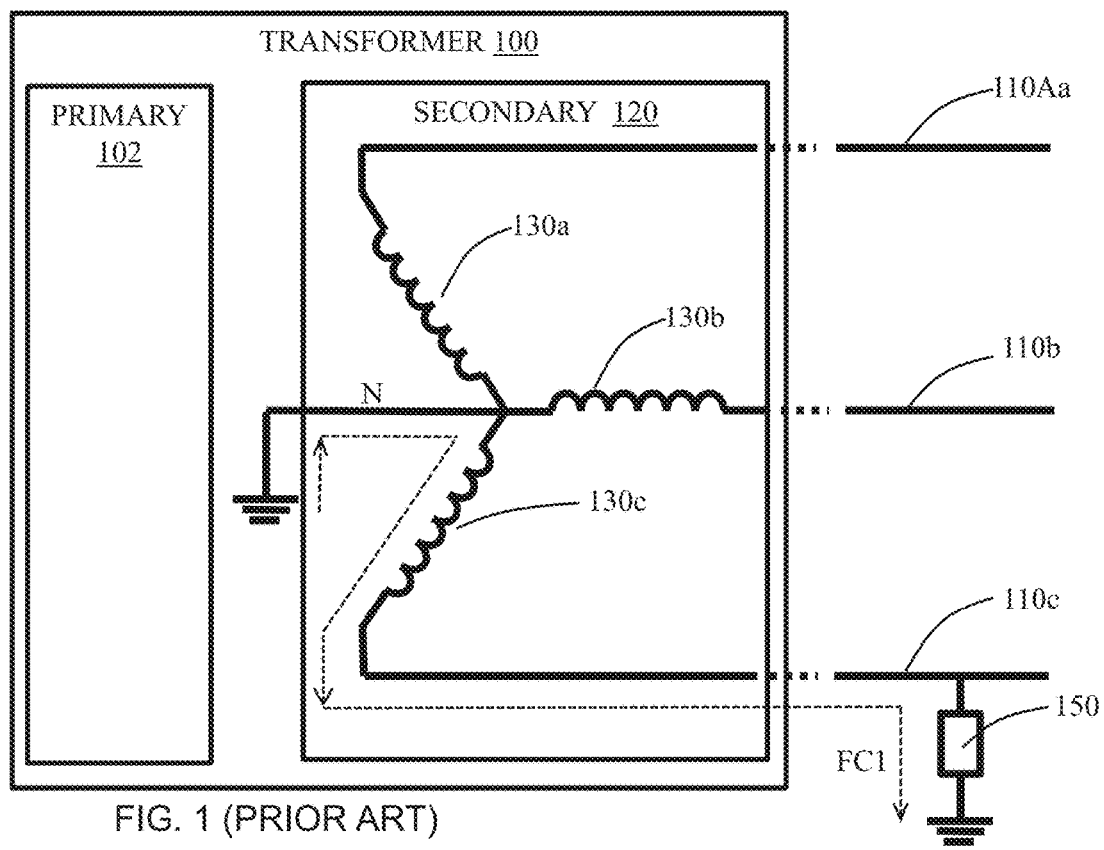
FIG. 1 is diagrammatic illustration of fault current in a grounded transformer, in accordance with the prior art.
Figure 2:
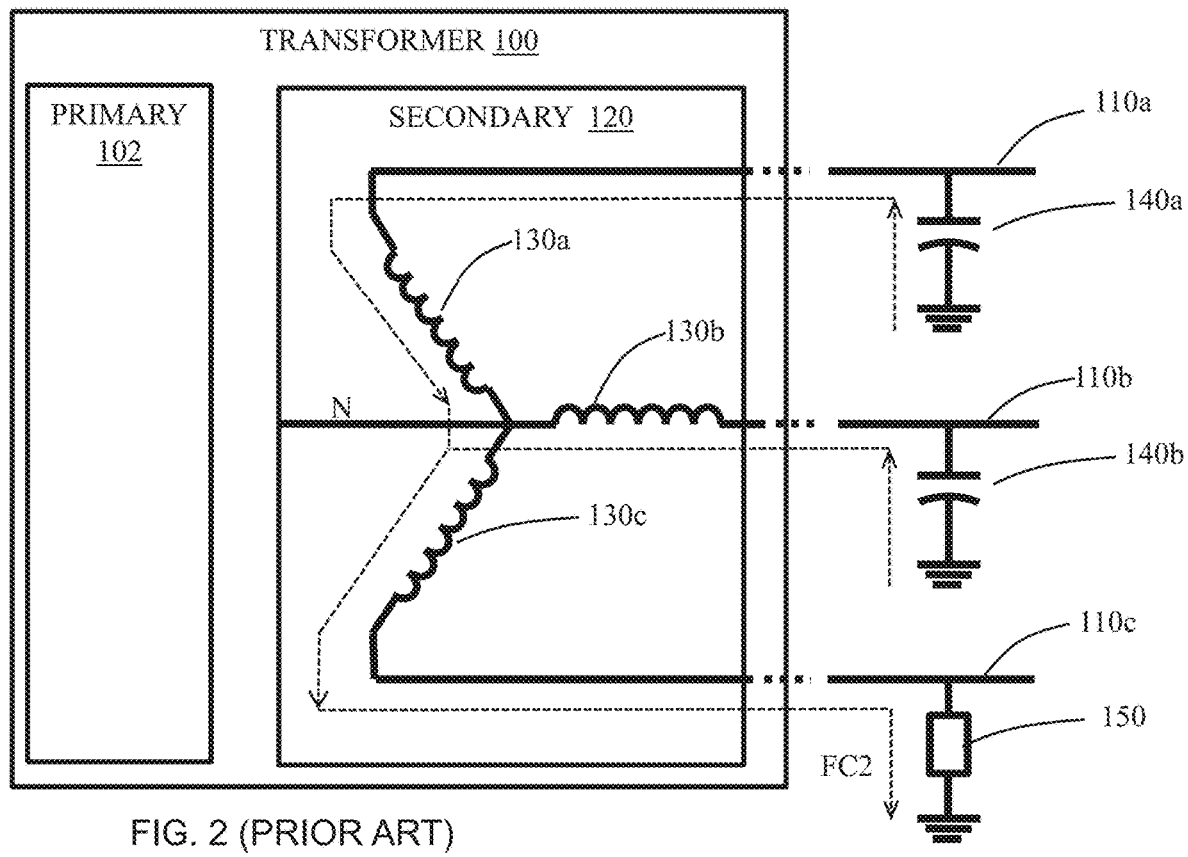
FIG. 2 is diagrammatic illustration of fault current in an ungrounded transformer, in accordance with the prior art.
Figure 3:
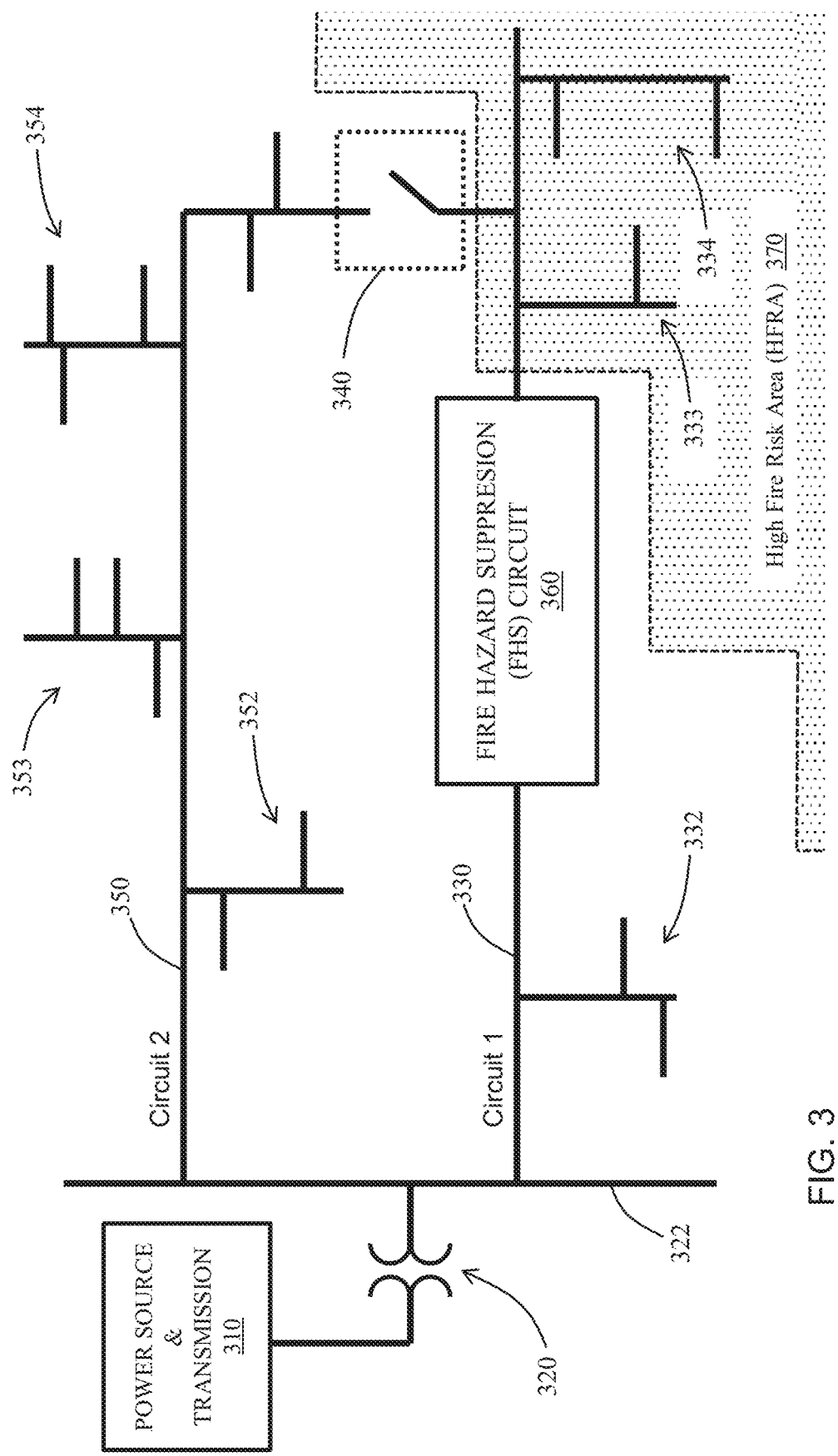
FIG. 3 is a diagrammatic illustration of a power grid including a novel fire hazard suppression circuit, in accordance with the preferred embodiment of the present invention.

The invention in some embodiments is a circuit configured to suppress fault currents in a power distribution network, as shown in FIG. 3. The power distribution network, sometimes referred to as a power grid, is configured to bring various utilization voltages, such as 480, 240, 208, or 120 volts, of electricity to the homes and businesses of a city, community, or county. The power originates from one or more power plants and an extensive network of transmission lines 310 operating at 500 kilovolts (kV), for example, to minimize resistive losses.

The high voltage lines branch out at a plurality of substations with step-down transformers 320 that reduce the carrier voltage, for example, to approximately 66 kV. The substation 320 may further includes a high voltage bus 322 to feed a plurality of subtransmission power lines or power circuits operated at 66 kV, for example. The 66 kV power lines, in turn, commonly extend to additional stepdown distribution voltage substations, as an example converting the voltages to 12 kV, though in some cases these lines extend to customers of the power company. These power lines may include hundreds or even thousands of miles of electric supply lines, including both overhead transmission lines and underground transmission lines. The plurality of power circuits includes a first circuit 330 and second circuit 350 operating at distribution voltages, as an example, 12 kV phase-to-phase. Each of these circuits 330, 350 includes a main trunk and branches 332-334, 352-354. The branches may correspond to communities, individual streets, or businesses. The voltage of the power lines may be stepped down again to the utilization voltages using a transformer (not shown) on the circuit near those customers being serviced by the main trunk or the branch.

The plurality of power circuits may operate independent of one another or be connected together to provide redundancy. As illustrated in FIG. 3, the first circuit 330 and second circuit 350 meet at switch 340. In normal operation, switch 340 is open so that the first and second circuits operate independently of one another. If and when it is necessary to supply power from a separate source, the switch 340 may be closed to supply power to customers via the other circuit. In order for this to occur without first de-energizing the circuits, however, the entirety of the first circuit 330 and second circuit must operate at the same voltage and phase rotation.

Figure 4:
FIG. 4 is a graphical representation of high fire risk areas in the state of California.

In accordance with some embodiments of the present invention, one or more power circuits may include a circuit for the suppression of fire hazard. The fire hazard suppression (FHS) circuit 360 is configured to reduce fault currents and thereby reduce the probability of a fire being created by a downed power line, by a power line in contact with a grounded object, or by an object that may create a grounded connection such as from tree, balloon, or other objects. The FHS can be configured as a type of Rapid Earth Fault Current Limiter (REFCL) as it substantially reduces the ground/earth current and energy that can be delivered by the powerlines in the prescriptive time durations. The FHS circuit 360 is optimally placed upstream and adjacent to a designated High Fire Risk Area (HFRA) 370, which refers to a region in which the risk of fire is high enough to warrant special measures. As illustrated in FIG. 4, the HFRA areas 370 in the state of California are represented in the form of a color coded graph or map. The darkest portions of the map indicate the areas highest risk.

Figure 5:
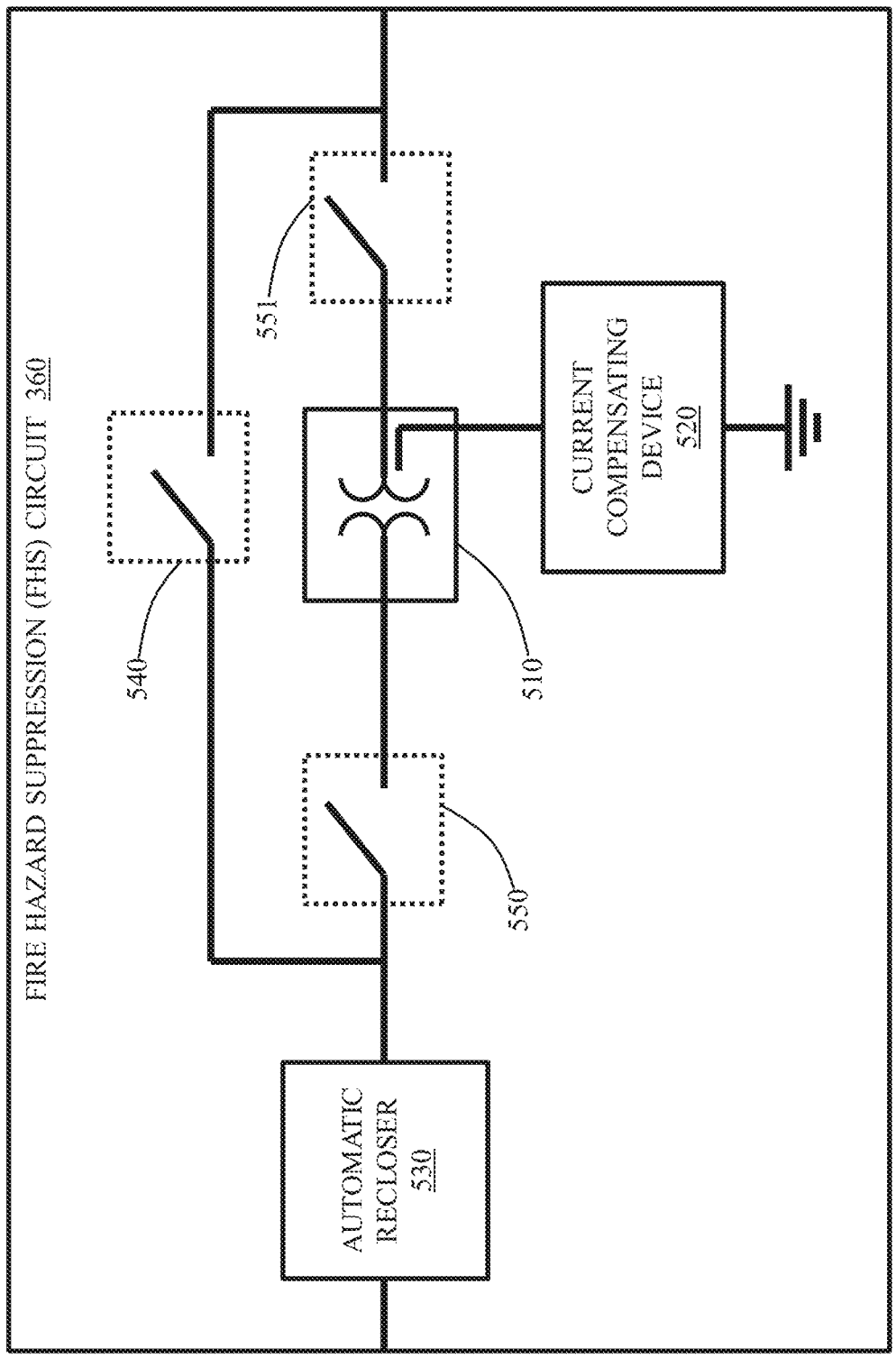
FIG. 5 is a circuit diagram of the novel fire hazard suppression circuit, in accordance with the preferred embodiment of the present invention.

Illustrated in FIG. 5 is a fire hazard suppression (FHS) circuit in accordance with an exemplary embodiment of the present invention. The FHS circuit 360 includes an isolation transformer 510, a current compensating device 520, and protection circuit. The isolation transformer 510 is configured to electrically isolate the source side network of the electricity from the load side without changing the system line voltage or phase angle. The source and load are electrically isolated if current cannot flow directly between the source and load. In the preferred embodiment, the isolation transformer 510 provides a one-to-one voltage between the primary and secondary sides of the transformer through coupling of their magnetic fields. As one skilled in the art will appreciate, appreciable current does not flow directly between the primary and secondary sides of the transformer.

The current compensating device 520 is configured to divert or cancel current during a ground fault, thereby preventing the current from passing to ground through the object that caused the fault to occur in the first place. In some embodiments, the current compensating device 520 is configured to create a current to cancel the fault current, thereby minimizing the current passing to ground through the subject object. In the preferred embodiment, the current compensating device 520 is either connected to a transformer neutral and may include a neutral connection where the isolation transformer does not.

The protection circuit in the preferred embodiment includes a fault interrupting device, preferably an automatic recloser 530. An automatic recloser is a type of switch that is configured to automatically interrupt a circuit from measurements provided to a controlling relay, i.e., open, when a fault is detected; in typical applications faults are detected when an overcurrent or overvoltage is identified and continuing for a predetermined duration. By opening, the automatic recloser 530 prevents the elevated current from damaging or otherwise affecting the substation or other circuits and circuitry connected on the source side of the automatic recloser and/or the associated isolation transformer 510. After a preset time after the switch is tripped, the automatic recloser generally 530 closes again (recloses), which re-energizes the power line including the isolation transformer 510. Generally, if the condition that caused the fault, or another fault, and related overcurrent or overvoltage is still present, the automatic recloser 530 opens again. This sequence is repeated a predetermined number of times until the faulted condition is cleared or the automatic recloser switching device locks out (remains open). In some embodiments, the protection circuit further includes an alarm configured to notify control personnel when the overcurrent condition, or overvoltage condition, is detected and/or to send notifications of the automatic recloser status's such as open or closed position.

The FHS circuit 360 also includes a bypass switch 540 and a plurality of isolation switches 550-551. Under normal circumstances, the bypass switch 540 is open and the isolation switches 550-551 closed. For purposes of maintenance or repair, however, the bypass switch 540 may be closed and the isolation switches 550-551 opened in order to route current away from the isolation transformer 510 and through the bypass switch 540. To be able to close the bypass switch without first de-energizing the circuits it is necessary that the isolation transformer does not substantially change the voltage or phase angle.

The isolation transformer 510 and current compensating device 520 may be implemented in several different ways without deviating from the present invention. As illustrated in FIG. 6A, a first embodiment of the isolation transformer includes a delta-zigzag transformer. The primary side 600 of the isolation transformer 510 includes three inputs A1-C1 and three coils or windings 610A-610C wired together in a delta configuration, i.e., with the coils or windings 610A-610C interconnected in delta pattern. The inputs are connected to the 12 kV three phase lines from the substation bus 322. The delta wiring configuration is illustrated diagrammatically in FIG. 6B with the three coils connected end to end.

The secondary side 620 of the isolation transformer 510 includes three outputs a1-c1 and six coils or windings 630a-630c, 640a-640c wired together in a zigzag configuration, i.e., with the six coils or windings 630a-630c, 640a-640c interconnected in a zigzag pattern. The zigzag wiring configuration is illustrated diagrammatically in FIG. 6C with three pairs of coils connected at a common point to form a neutral. N. The three outputs, including 12 kV three phase lines, provide power to the load side of the first power circuit 330. In the preferred embodiment, the three inputs A1-C1 and outputs a1-c1 are characterized by the same line voltage and phase angle.

As stated, the zigzag configuration on the secondary side 620 produces a neutral, N, and maintains the phase angle relationship with the source system. The current compensating device 520 connects between the neutral and ground. The current compensating device 520 in the preferred embodiment is an arc suppression coil 650, which is a form of variable inductor. The arc suppression coil 650 is tuned to provide resonant grounding for the portion of the circuit on the load side of the isolation transformer 510. As stated above, the power lines, especially overhead power lines, can be modeled based on their effective capacitance while the are suppression coil is modeled based on its inductance. The arc suppression coil is properly tuned to the load side of the power lines when the inductance of the arc suppression coil 650 is equal to the capacitance of the power line(s) a1-c1.

While the particular power line on which the fault occurs may still conduct current on the faulted phase, a substantial portion or all the fault current on the other two lines of the three phase system flow through the arc suppression coil 650, when properly tuned. As such, the aforementioned fault current discharges through the arc suppression coil instead of the object or conducting path that created the ground fault condition. In the preferred embodiments, at least 90 percent of the fault current flows through the current compensating device instead of the object that caused the fault.

In some other embodiments, the current compensating device 520 comprises an inverter that connects between the neutral and a ground electrode. An inverter (not shown), which is known to those of ordinary skill in the art, employs power electronics and programmable controller to control the voltage on the neutral. The inverter is then configured to inject a current onto the power line on which the fault has occurred. The injected voltage is equal in magnitude but has the opposite phase (180 degrees out of phase) of the voltage of the faulted power line immediately prior to the fault occurring. The injected current therefore cancels out some or all of the fault current on the line experiencing the fault.

Figure 7:
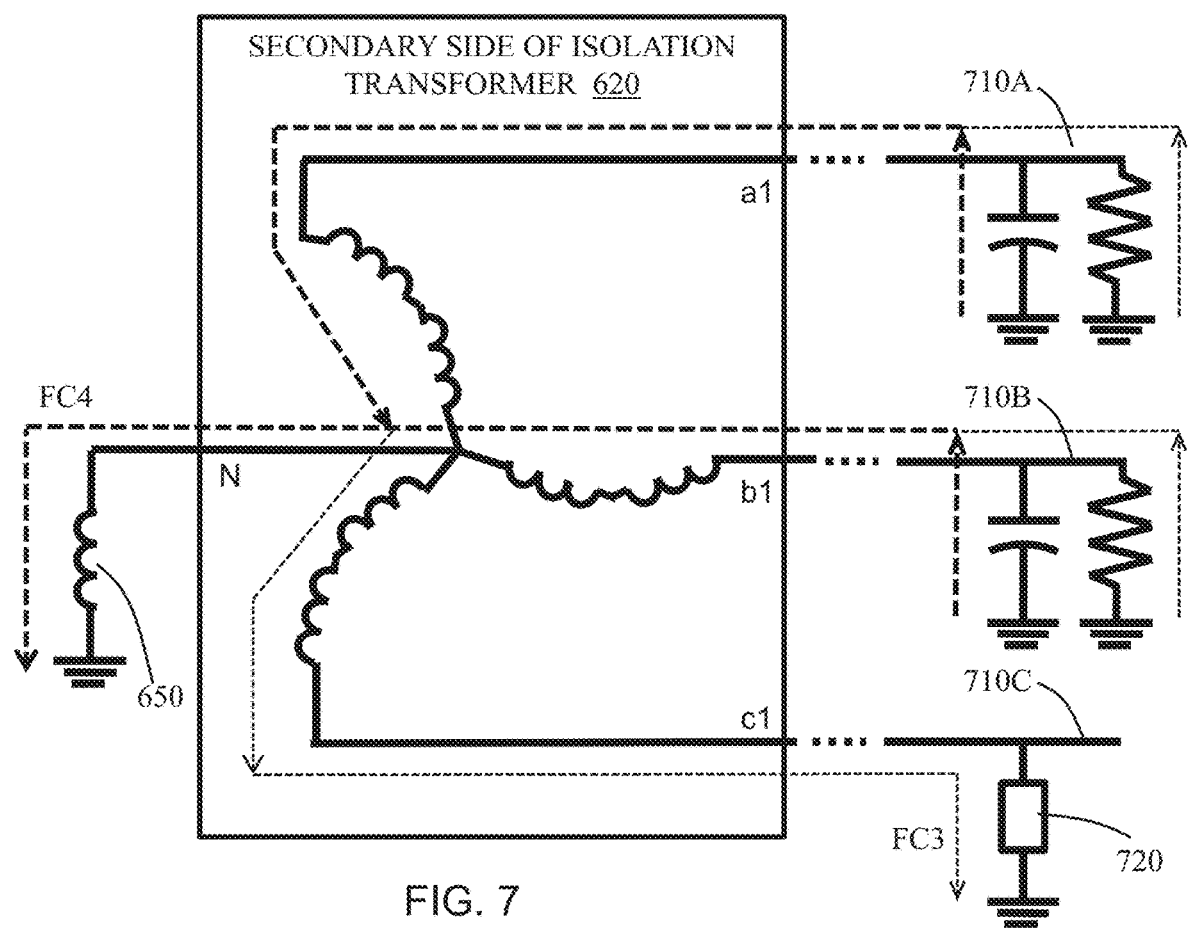
FIG. 7 is a diagrammatic illustration of fault current through an isolation transformer, in accordance with the first embodiment of the present invention.

Illustrated in FIG. 7 a diagrammatic representation of the first embodiment of the FHS circuit under a fault condition. The secondary side 620 of the isolation transformer includes a zigzag coil configuration coupled to three transmission lines at three difference phases. Two phases of the three phase distribution are represented qualitatively by their capacitance and resistance equivalence 710A, 710B. As described above, the capacitance of the distribution phases is a function of the coupling to ground as well as the length of the power line. If and when an object 720 comes in contact with the third distribution phase 710C, for example, a fault may occur and current run directly from the third distribution phase, through the object, and then to ground.

The arc suppression coil—when tuned to match the capacitance of the first two phases 710A, 710B—discharges substantially all the fault current from the first two phases 710A, 710B. Although the fault current may include the residual current. FC3, propagating on the third phase 710C, the invention prevents current, FC4, on the first two phases 710A, 710B from flowing through the third phase 710C or object 720. The reduced fault current effectively reduces the risk of ignition of the object. When the current compensating device 520 employs an inverter, the fault current through the object may be reduced even further.

As illustrated in FIG. 8A, a second embodiment of the isolation transformer 510 includes a delta-delta transformer. The primary side 800 of the isolation transformer 510 includes three inputs A1-C1 and three coils or windings 810A-810C wired together in a delta configuration. The inputs are connected to the 12 kV three phase distribution lines from the substation bus 322. The delta wiring configuration is illustrated diagrammatically in FIG. 8B with the three coils connected end to end.

Similarly, the secondary side 820 of the isolation transformer 510 includes three outputs a1-c1 and three coils or windings 830a-830c also wired together in a delta configuration. The delta wiring configuration is illustrated diagrammatically in FIG. 8C with the three coils connected end-to-end. The three outputs, including 12 kV three phase electric lines, provide power to the load side of the first power circuit 330. In the preferred embodiment, the three inputs A1-C1 and outputs a1-c1 are characterized by the same line voltage and phase angle. As is well known, the delta secondary side does not produce a neutral.

In this embodiment, the current compensating device 520 includes a grounding transformer 830, i.e., a grounding bank, connected to the three phase output of the secondary 820. The grounding transformer 830 provides a neutral line common connection, N, where the isolation transformer does not. In one embodiment, an inductor or arc suppression coil 850 then connects between that neutral, N, and ground. In another embodiment, an inverter (not shown) connects between that neutral, N, and ground. In the case of an arc suppression coil 850 or inverter, fault currents on one or more power lines are discharged to ground through the current compensating device 520 instead of the object causing the fault.

In some embodiments, the relay controlling the automatic recloser 530 determines when to trip the switch that terminates power based on a voltage sensor or voltage transformer device. This device may measure a voltage based on the difference between (a) ground potential and (b) the voltage at the neutral provided by the grounding transformer 830. When the measure voltage difference exceeds a predetermined threshold, the automatic recloser 520 trips the switch that provides power to the load side of the circuit.

In the preferred embodiment, the ground connection in the embodiments described above may include one or more copper-clad steel ground rods driven into the earth.

Figure 9:
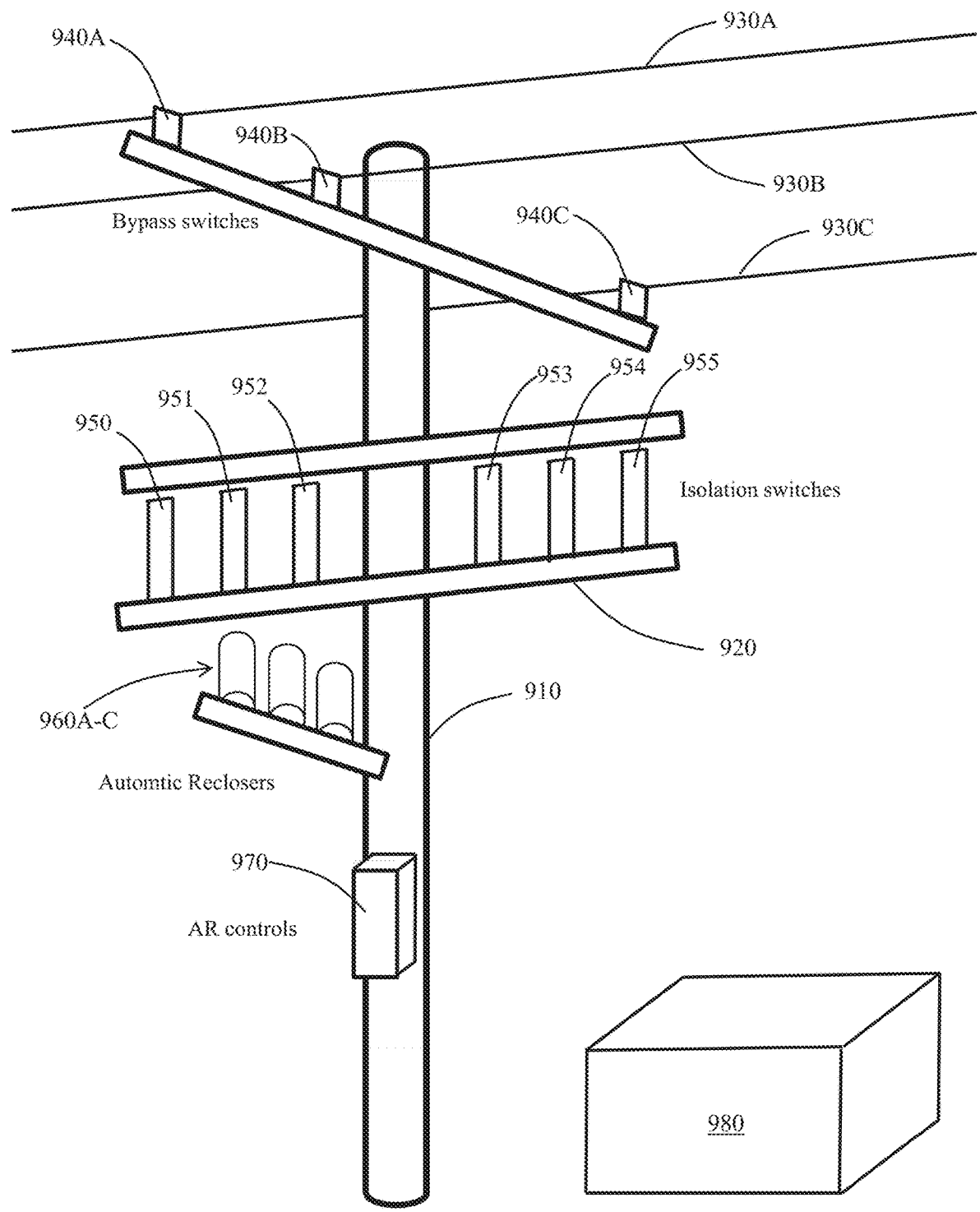
FIG. 9 is a diagrammatic illustration of the fire hazard suppression circuit implemented on a power pole, in accordance with one embodiment of the present invention.

Illustrated in FIG. 9 is a diagrammatic illustration of a FHS circuit implemented in the field. In one embodiment, the FHS circuit 360 is implemented in conjunction with at least one wood, composite material, concrete, or metal pole 910. The power pole 910 includes a plurality of cross members 920 on which components are mounted. In one example, the bypass switches 940A-940C are mounted on a top cross member where they are connected directly to the three power lines 930A-930C. The bypass switching device is configured to route power around the isolation transformer 980 when necessary. The bypass switches 930A-930C, in turn, are connected to the isolation switches 950-955, which are configured to disconnect the isolation transformer 980 from the source and load sides of the first circuit 330 when necessary. The automatic reclosers 960A-C are also mounted on a cross member where they are connected to the source side of the first circuit 330. A control panel with manual controls or relay 970 for the automatic reclosers 960A-C may also be mounted on the power pole 910 where they are accessible to linesmen servicing the power line. In the preferred embodiment, the isolation transformer 980 is installed on a pad mount structure, but may be mounted overhead on the power pole 910 or in subsurface structures in other embodiments.

Figure 10:
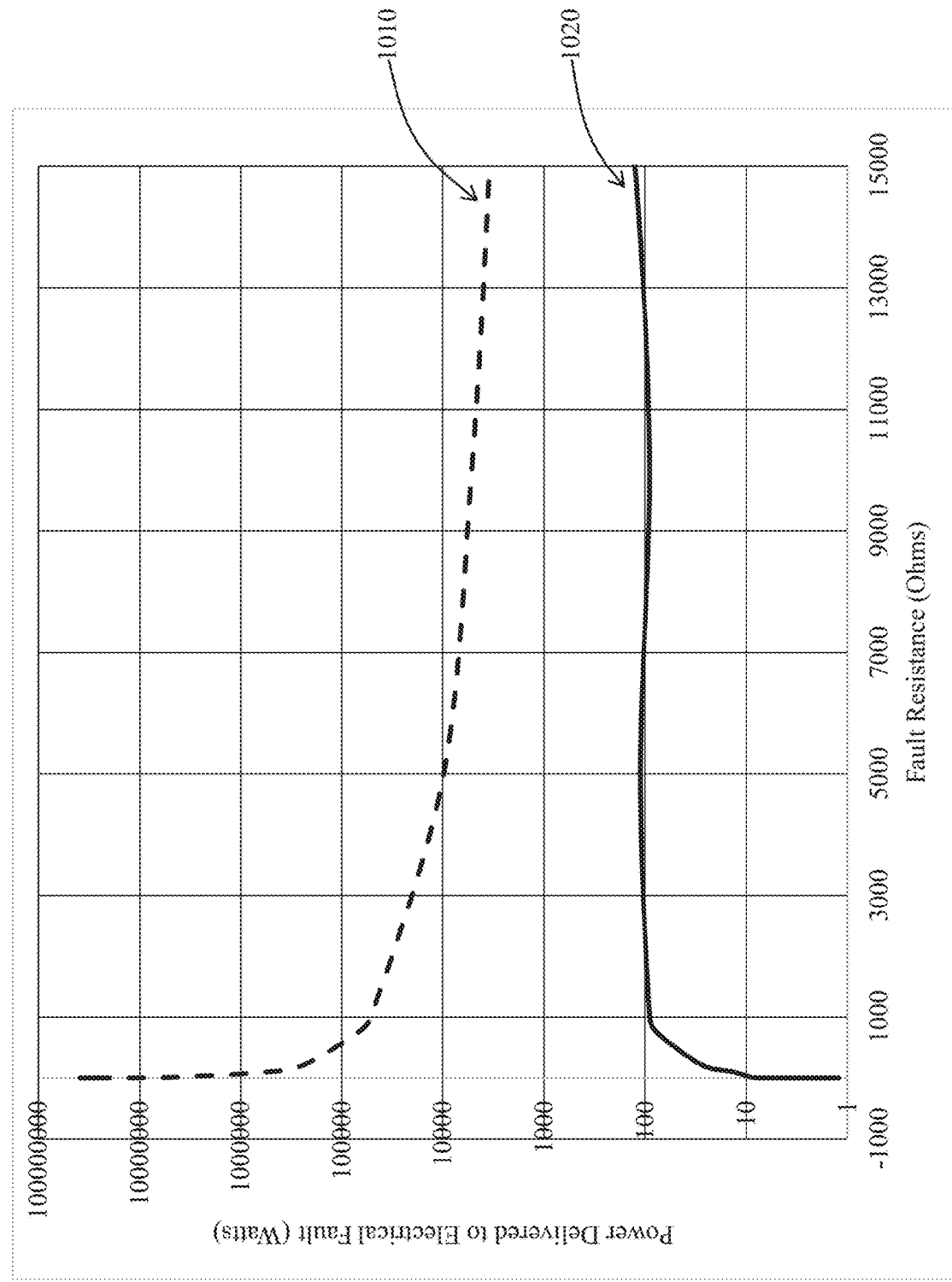
FIG. 10 is a diagrammatic illustration of the reduction in fault current with the present invention.

FIG. 10 is a diagrammatic illustration of the reduction of fault current produced by the present invention. The power delivered to an electrical fault, which is related to the square of the fault current, is shown on the vertical axis. This fault power is mapped for a range of fault resistances shown on the horizontal axis. The fault power in a prior art power solidly grounded distribution circuit is shown by the dashed line 1010 while the fault power in the power distribution circuit of the present invention is shown by the solid line 1020.

As shown, for a wide range of fault resistances, the fault power in a prior art power circuit is much higher than the fault power in a FHS power circuit. As can be seen, the FHS circuit 360 can reduce the fault power from approximately 10,000 watts to 100 watts, i.e., representing an improvement of two orders of magnitude.

One or more embodiments of the present invention may be implemented with one or more computer readable media, wherein each medium may be configured to include thereon data or computer executable instructions for manipulating data. The computer executable instructions include data structures, objects, programs, routines, or other program modules that may be accessed by a processing system, such as one associated with a general-purpose computer or processor capable of performing various different functions or one associated with a special-purpose computer capable of performing a limited number of functions. Computer executable instructions cause the processing system to perform a particular function or group of functions and are examples of program code means for implementing steps for methods disclosed herein. Furthermore, a particular sequence of the executable instructions provides an example of corresponding acts that may be used to implement such steps. Examples of computer readable media include random-access memory ("RAM"), read-only memory ("ROM"), programmable read-only memory ("PROM"), erasable programmable read-only memory ("EPROM"), electrically erasable programmable read-only memory ("EEPROM"), compact disk read-only memory ("CD-ROM"), or any other device or component that is capable of providing data or executable instructions that may be accessed by a processing system. Examples of mass storage devices incorporating computer readable media include hard disk drives, magnetic disk drives, tape drives, optical disk drives, and solid state memory chips, for example. The term processor as used herein refers to a number of processing devices including personal computing devices, servers, general purpose computers, special purpose computers, application-specific integrated circuit (ASIC), and digital/analog circuits with discrete components, for example.

Although the description above contains many specifications, these should not be construed as limiting the scope of the invention but as merely providing illustrations of some of the presently preferred embodiments of this invention.

Therefore, the invention has been disclosed by way of example and not limitation, and reference should be made to the following claims to determine the scope of the present invention.

We claim:

1. A circuit for a power distribution network, the network comprising a three phase input characterized by a first voltage and a first phase angle, and a three phase output, the circuit comprising:
   a) an isolation transformer comprising:
      i) a primary side comprising a plurality of primary coils configured to connect to the three phase input; and
      ii) a secondary side comprising at least three secondary coils configured to connect to the three phase output, wherein the output is characterized by a second voltage and second phase angle, wherein the first phase angle and the second phase angle are substantially equal;
   b) a neutral connected to the secondary side;
   c) a current compensating device connected to the neutral and configured to redirect a substantial portion of a fault current present on the three phase output through the neutral;
   d) a bypass switch in parallel with the isolation transformer;

e) at least one isolating disconnect in series with the isolation transformer; wherein the bypass switch and the at least one isolating disconnect are configured to:
  i) connect the three phase input to the three phase output through the isolation transformer alone when the isolation transformer is operational; and
  ii) connect the three phase input to the three phase output through the bypass switch alone when the isolation transformer is non-operational; and
f) a protection system configured to:
  i) clear a fault involving two or more phases on the three phase output; and
  ii) generate an alarm or clear a fault, or both, when a voltage drop is detected on at least one phase on the three phase output.

2. The circuit of claim 1, wherein the plurality of primary coils are interconnected in a delta configuration, and the secondary coils are connected in a delta configuration.

3. The circuit of claim 2, wherein the first voltage and the second voltage are substantially equal.

4. The circuit of claim 1, wherein the plurality of primary coils are interconnected in a delta configuration, and wherein the secondary coils are connected in a zigzag configuration.

5. The circuit of claim 4, wherein the first voltage and the second voltage are substantially equal.

6. The circuit of claim 1 wherein the current compensating device comprises an arc suppression coil.

7. The circuit of claim 1 further comprising a grounding electrode, and the current compensating device comprises an inverter configured to inject current to redirect some or all of the fault current to the grounding electrode.

8. The circuit of claim 7, wherein the isolation transformer comprises the neutral, and wherein the inverter is connected to the isolation transformer neutral.

9. The circuit of claim 7, further comprising a grounding bank, wherein the grounding bank comprises the neutral and the inverter is connected to the neutral of the grounding bank.

10. The circuit of claim 1, wherein the protection system comprises a circuit breaker.

11. The circuit of claim 10, wherein the circuit breaker comprises an automatic recloser.

12. The circuit of claim 11, wherein the automatic recloser comprises a relay configured to monitor voltage on the isolation transformer neutral.

13. The circuit of claim 11, wherein the protection system further comprises at least one fuse.

* * * * *